(12) United States Patent
Chern

(10) Patent No.: US 6,287,921 B1
(45) Date of Patent: *Sep. 11, 2001

(54) METHOD OF PERFORMING THRESHOLD VOLTAGE ADJUSTMENT FOR MOS TRANSISTORS

(75) Inventor: Yuh-Sheng Chern, Hsinchu (TW)

(73) Assignee: Vanguard International Semiconductor Corporation, Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/537,175

(22) Filed: Mar. 29, 2000

(51) Int. Cl.$^7$ .................................................. H01L 21/336
(52) U.S. Cl. ........................ 438/289; 438/296; 438/419; 438/424
(58) Field of Search .................... 438/194, 221, 438/289, 291, 296, 298, 359, 404, 419, 420, 424, 436, 450, 451, 524, 552, 561

(56) References Cited

U.S. PATENT DOCUMENTS

| 6,051,479 | * | 4/2000 | Hong | 438/425 |
| 6,069,057 | * | 5/2000 | Wu | 438/424 |
| 6,069,058 | * | 5/2000 | Hong | 438/436 |
| 6,100,161 | * | 4/2000 | Yu et al. | 438/424 |

* cited by examiner

*Primary Examiner*—Charles Bowers
*Assistant Examiner*—Jack Chen
(74) *Attorney, Agent, or Firm*—Bacon & Thomas

(57) ABSTRACT

The invention discloses a method of forming threshold voltage adjustment for MOS transistors. At first, a first oxide layer and a nitride layer are formed on a silicon substrate in sequence. Next, shallow trenches and active regions are formed by using photolithography and dry etching technology. A wet etching step is performed to remove part of the nitride layer, and then the first ion implantation for threshold voltage adjustment are performed. After accomplishing shallow trench isolations, the second ion implantation for threshold voltage adjustment are finally performed.

20 Claims, 3 Drawing Sheets

METHOD OF PERFORMING THRESHOLD VOLTAGE ADJUSTMENT FOR MOS TRANSISTORS

BACKGROUND OF THE INVENTION

1. Field of the Invention

The present invention relates to a method of performing threshold voltage adjustment for MOS transistors, more particularly, to a method of forming a MOS transistor with precise and stable threshold voltage.

2. Description of the Prior Art

Integrated Circuit (IC) technology has produced dramatic advances over the past 20 years. The increasing of the semiconductor device's integration necessitates the shrinkage of the critical dimension of the MOS devices. With further shrinking of dimensions, the circuit processes become more stringent; old requirements are tightened, and new requirements have to be considered. In order for obtaining absolute isolation, threshold voltage for the field-oxide areas must be higher to isolate individual devices. The localized oxidation isolation method (LOCOS) was the most dominant isolation process used in IC technologies in the past. However, it is quietly difficult to reduce the bird's beak length to much less than 0.1 um per side with totally flat topology. Therefore, for sub-quarter-micronmeter technology, a new approach to isolation with totally flat topology was recently disclosed, i.e. shallow trench isolation (STI).

A paper "A New Trench Isolation Technology as a Replacement of LOCOS" was disclosed in IEDM Tech. Dig., 578(1984) by H. Mikoshiba et al. Referring now to FIG. 1, a cross-sectional diagram of a shallow trench isolation on the basis of the prior art is shown. Firstly, trenches about 0.3 to 0.8 um deep are anisotropically etched into the silicon substrate 10 through dry etching (only one trench is shown in the Figure). Active regions are those that are protected from the etch when the trenches are created. A thermal oxidation process is performed to form an oxide layer 60, so as to anneal the damaged sidewall of the shallow trenches. Next, a CVD oxide layer is deposited on the wafer surface and then etched back to form the shallow trench isolations 80 so that it remains only in the recesses, with its top surface at the same level as the original silicon surface. Etchback is performed using a sacrificial photoresist method, or a CMP (Chemical Mechanical Polishing) process. After the formation of shallow trench isolations 80, active devices are going to be fabricated. CMOS circuits require a balanced pair of n- and p-channel enhancement mode devices (hereinafter NMOS and PMOS) on the same chip. In order to obtain matched complementary devices, ion implantation processes for threshold voltage adjustment of NMOSs and PMOSs are needed.

As shown in FIG. 1, there is a silicon/silicon dioxide interface between the shallow trench isolations and the active regions. Though a thermal oxidation process is performed during the STI formation process, there are unavoidably lots of defects existing on the interface. There are still many thermal steps in the subsequent process, so that the doped impurities (P- or N-type) for threshold voltage adjustment diffuse along the interface toward the bottom of the shallow trenches. The arrow in FIG. 1 shows the diffusing direction. As a result, the doping concentration for threshold voltage adjustment loses during the thermal steps. Consequently, the final threshold voltage of each PMOS or NMOS is different from the original design. This variation of threshold voltage results in poor yield and bad reliability.

SUMMARY OF THE INVENTION

Therefore, an object of this invention is to provide a method of performing the threshold voltage adjustment for MOS transistors.

This is another object of this invention is to provide a method of forming a shallow trench isolation.

This is further another object of this invention is to provide a MOS transistor with precise and stable threshold voltage.

On the basis of the present invention, a first oxide layer and a nitride layer are firstly formed on a silicon substrate in sequence. Thereafter, shallow trenches and active regions are formed by means of photolithography and anisotropic drying etching steps. Next, a thermal oxidation process is performed to form a very thin oxide layer on the inner sidewall of the shallow trenches. A wet etching step is then performed to the nitride layer to remove the nitride layer in the range between 30 to 300 Angstroms laterally and vertically. Next, the first ion implantation process for threshold voltage adjustment is performed.

A second oxide layer is deposited to fill the shallow trenches. Next, a process of chemical mechanical polishing (CMP) is performed to remove the second oxide layer on the nitride layer so that it remains only in the recesses, with its top surface at the same level as the nitride layer. The top surface of the nitride layer is thus exposed. Thereafter, the nitride layer, the part of the second oxide layer on the silicon substrate surface, and the first oxide layer are continuously removed to accomplish the process of shallow trench isolations. Finally, the second ion implantation for threshold voltage adjustment is performed, and the whole threshold voltage adjustment is accomplished.

Because the edge of the active regions has much higher dopant concentration, the dopant(s) at the active regions won't diffuse toward the edging regions during the subsequent thermal processes. As a result, the drawback of losing dopant concentration in the convention art is overcome. Therefore, the MOS transistors by means of this present invention have very precise and stable threshold voltage.

BRIEF DESCRIPTION OF THE DRAWINGS

A more complete understanding of the invention can be obtained by considering the following detailed description in conjunction with the accompanying drawing, in which.

DETAILED DESCRIPTION OF THE PREFERRED EMBODIMENTS

The present invention relates to the method of performing threshold voltage adjustment for MOS transistors. A MOS transistor with stable and precise threshold voltage can be obtained by means of the present invention, which is available for a DRAM, a SRAM, a Flash, and any types of logic integrated circuits. CMOS circuits require a balanced pair of n- and p-channel enhancement mode devices (hereinafter NMOS and PMOS) on the same chip. In order to obtain matched complementary devices, ion implantation steps for threshold voltage adjustment of NMOSs and PMOSs are needed. The steps of threshold voltage adjustment by P-type and N-type implantation are described in the first embodiment and the second embodiment respectively.

First Embodiment

Figure 1:
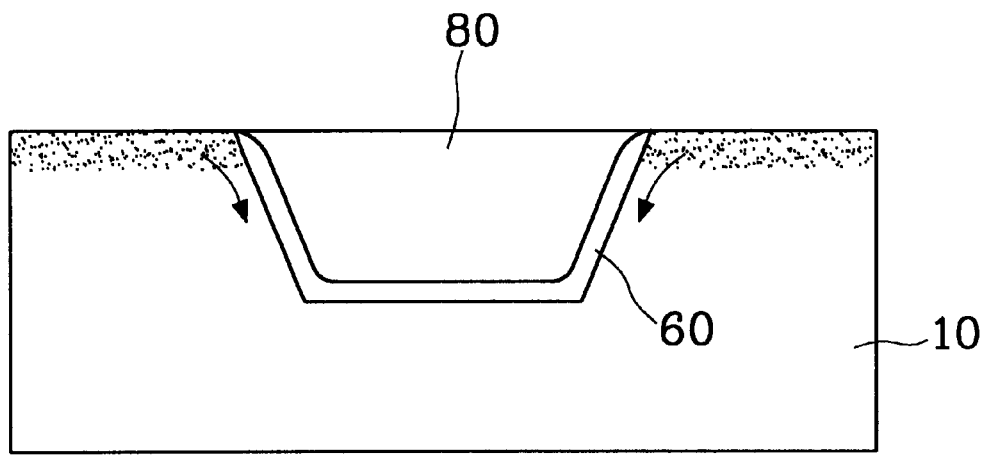
FIG. 1 is a cross-sectional diagram of shallow trench isolation on the basis of the prior art.
Figure 2:
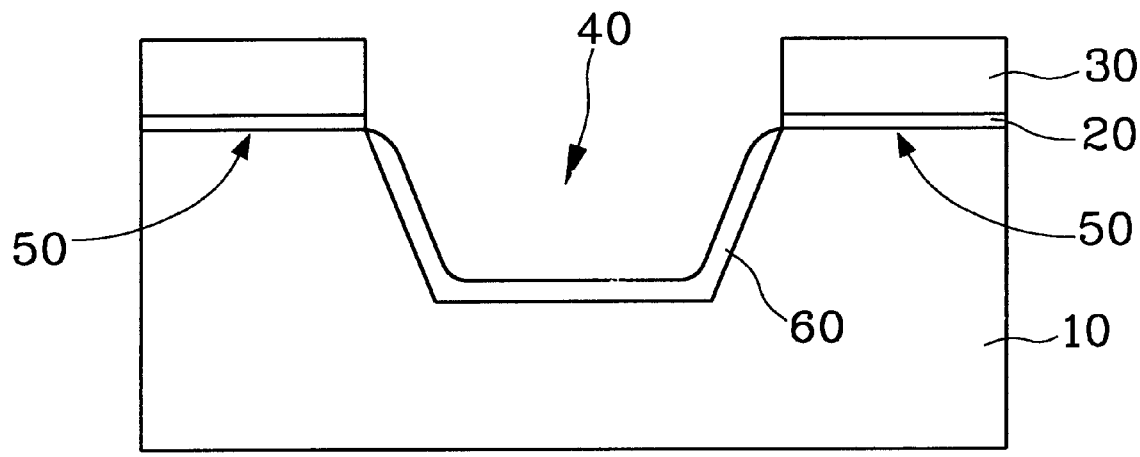
FIG. 2 is a schematic diagram of forming a shallow trench according to the present invention.

On the basis of the present embodiment, two ion implantation steps by P-type semiconductor are performed for threshold voltage adjustment. Referring now to FIG. 2, a schematic diagram of forming shallow trenches according to the present invention is shown (only one shallow trench is shown in the Figure in order for succinctness). A first oxide layer 20 and a nitride layer are deposited on a silicon substrate 10 in sequence. Thereafter, shallow trenches 40 and active regions 50 are formed by means of conventional photolithography and anisotropic drying etching steps. Next, a thermal oxidation process is performed to form a very thin oxide layer 60 on the inner sidewall of the shallow trenches 40.

The first oxide layer 20 is formed by means of chemical vapor deposition or thermal oxidation to a thickness in the range between 50 to 500 Angstroms. The first oxide layer 20 acts as a buffer layer of stress between the nitride layer 30 and silicon substrate 10. The nitride layer 30 is formed by using low pressure chemical vapor deposition (LPCVD) or the other CVD methods to a thickness in the range between 500 to 3000 Angstroms. The purpose of forming the nitride layer 30 is to act as a hard mask of active regions 50 during the dry etching process for opening the shallow trenches 40. The nitride layer 30 can be also replaced by an oxynitride layer. The drying etching step is operated to etch the nitride layer 30, the first oxide layer 20, and the silicon substrate 10 in sequence, in order to open the shallow trenches 40. The purpose of the thermal oxidation process is to anneal the sidewall of the shallow trenches 40, so that the damages induced by ion bombardment could be fixed.

Figure 3:
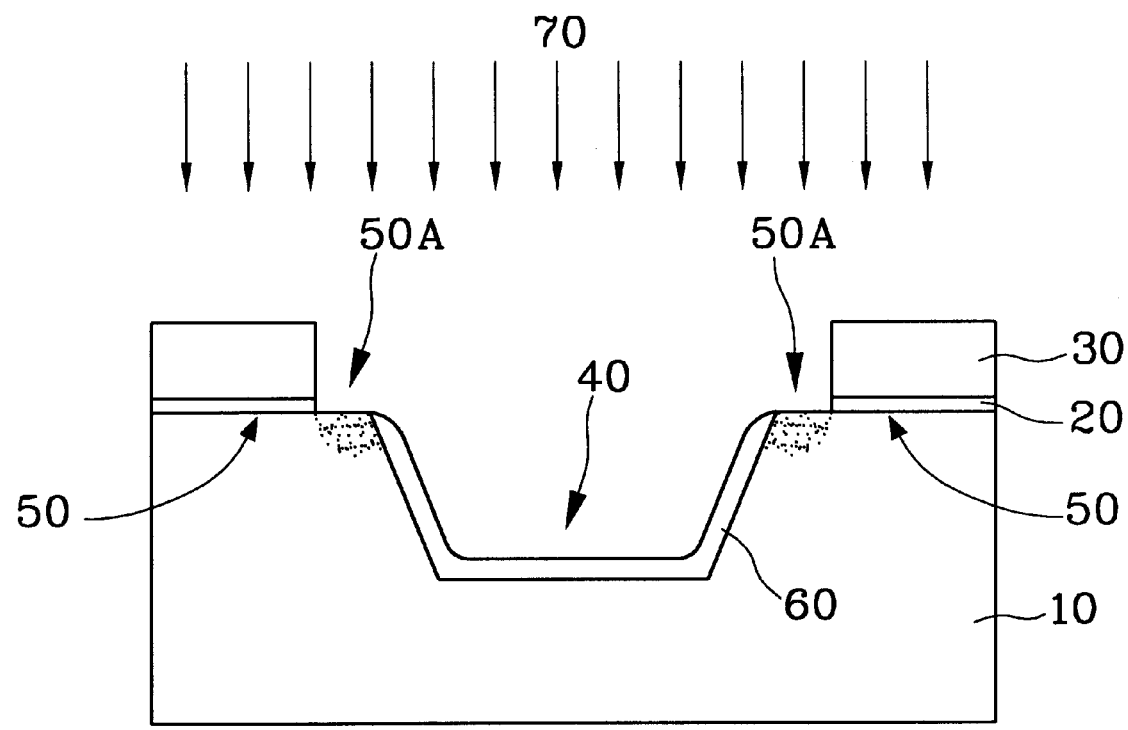
FIG. 3 illustrates a wet etching process to the nitride layer and the first ion implantation for threshold voltage adjustment according to the present invention.

Referring now to FIG. 3, a wet etching process to the nitride layer and the first ion implantation for threshold voltage adjustment according to the key feature of the present invention is shown. At first a wet etching step is performed to the nitride layer 30 to remove the nitride layer in the range between 30 to 300 Angstroms laterally and vertically, so that the part of the nitride layer at the edge of the active regions 50A (hereinafter edging regions 50A) is removed. Because the thickness of the nitride layer is much larger than that of the removed layer, most of the nitride layer 30 is left. Next, the first ion implantation process 70 for threshold voltage adjustment is performed.

The wet etching process of the nitride layer 30 is performed by heated phosphoric acid. The first ion implantation process 70 for threshold voltage adjustment makes use of boron or $BF_3$ as the dopant source in the 2- to 200-KeV range to penetrate through the first oxide layer 20 into the silicon substrate 10. The doping concentration must have the same numerical order with that of the subsequent second ion implantation for threshold voltage adjustment in the range between 1E12 to 1E14 $cm^{-2}$. About this step, the first ion implantation process 70 for threshold voltage adjustment is accepted only by the shallow trenches 40 and the edging regions 50A. Except the edging regions 50A, the silicon substrate 10 at the active regions are not ion-implanted because the nitride layer 30 serves as an implantation mask.

Figure 4:
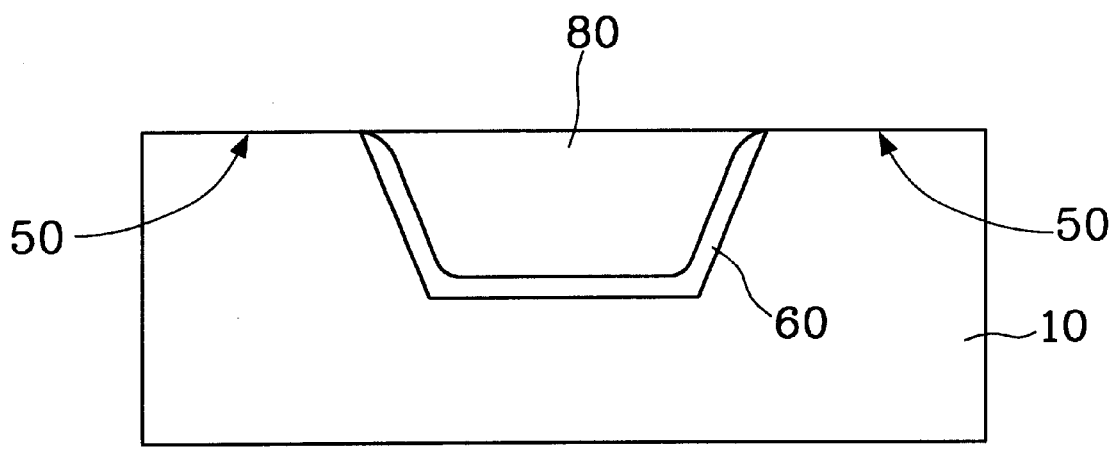
FIG. 4 shows the completion of shallow trench isolations according to the present invention.

Referring now to FIG. 4, shallow trench isolations 80 are completed. In order to complete the shallow trench isolations 80, a second oxide layer is deposited at first to fill the shallow trenches 40. Next, a process of chemical mechanical polishing (CMP) is performed to remove the part of the second oxide layer on the nitride layer 30, so that it remains only in the recesses, with its top surface at the same level as the nitride layer. The top surface of the nitride layer 30 is thus exposed. Thereafter, the nitride layer 30, the partial second oxide layer 30 on the silicon substrate 10, and the first oxide layer 10 are continuously removed to accomplish the process of shallow trench isolations 80.

The second oxide layer is formed by using high density plasma chemical vapor deposition (HDPCVD) or the other CVD technologies. The removal of the nitride layer 30 is performed by heated phosphoric acid. Both of the oxide layer are removed by means of wet etching process using HF.

Figure 5:
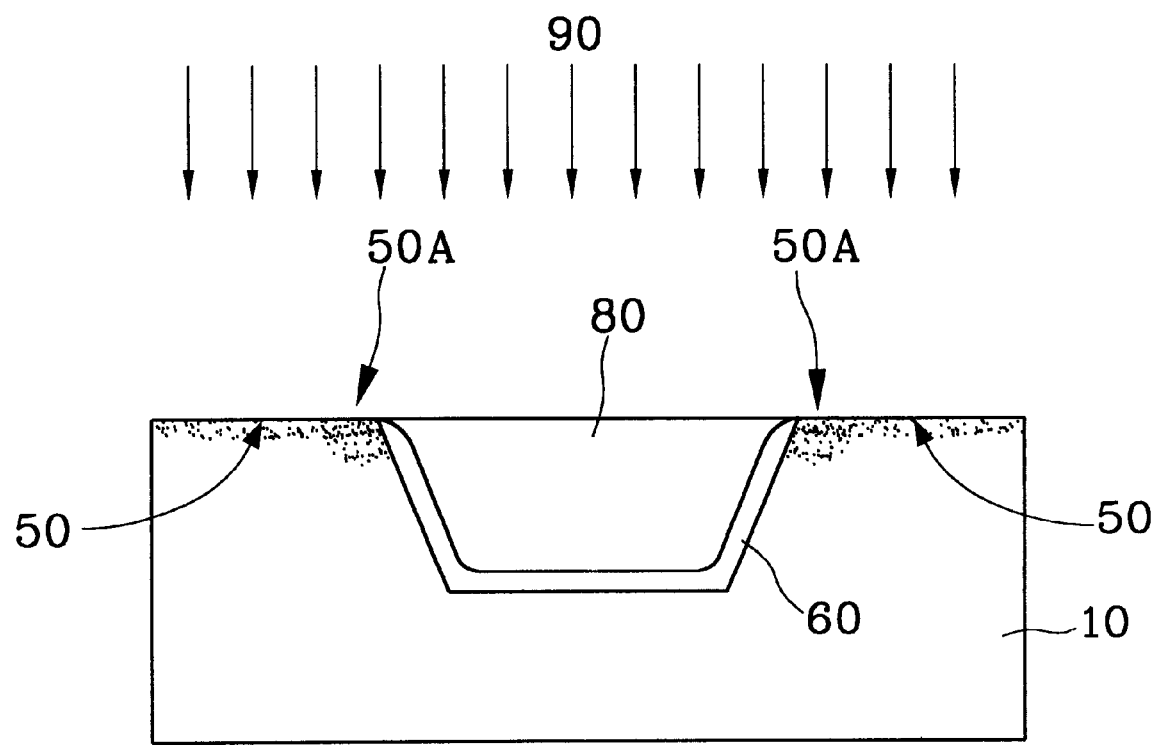
FIG. 5 schematically illustrates the second ion implantation for threshold voltage adjustment according to the present invention.

Referring now to FIG. 5, the second ion implantation process 90 for threshold voltage adjustment is performed, and the whole threshold voltage adjustment is accomplished. The second ion implantation process 90 for threshold voltage adjustment makes use of boron or $BF_3$ as the dopant source in the 2- to 200-KeV range to penetrate through the first oxide layer 20 into the silicon substrate 10. The choice of doping concentration depends on the real application in the range between 1E12 to 1E14 $cm^{-2}$.

As shown in FIG. 5, active regions 50 are ion-implanted by the second ion implantation process 90 for threshold voltage adjustment. However, according to both FIG. 3 and FIG. 5, the edging regions 50A are not only ion-implanted by the second ion implantation process 90, but also by the first ion implantation process 70 for threshold voltage adjustment. As mentioned above, the dopant concentration of the first ion implantation is at the same numerical order with that of the second ion implantation. As a results, the dopant concentration at the edging regions 50A is much heavier than that at the active regions 50. Because the edging regions 50A has much higher dopant concentration, the dopant at the active regions 50 won't diffuse toward the edging regions 50A during the subsequent thermal processes. As a result, the drawback of losing dopant concentration in the convention art is overcome. Therefore, the MOS transistors by means of this present invention have very precise and stable threshold voltage.

Second Embodiment

On the basis of the present embodiment, two ion implantation steps by N-type semiconductor are performed for threshold voltage adjustment. Referring now to FIG. 2, a schematic diagram of forming shallow trenches according to the present invention is shown (only one shallow trench is shown in the Figure in order for succinctness). A first oxide layer 20 and a nitride layer 30 are deposited on a silicon substrate 10 in sequence. Thereafter, shallow trenches 40 and active regions 50 are formed by means of conventional photolithography and anisotropic drying etching steps. Next, a thermal oxidation process is performed to form a very thin oxide layer 60 on the inner sidewall of the shallow trenches 40.

The first oxide layer 20 is formed by means of chemical vapor deposition or thermal oxidation to a thickness in the range between 50 to 500 Angstroms. The first oxide layer 20 acts as a buffer layer of stress between the nitride layer 30 and silicon substrate 10. The nitride layer 30 is formed by using low pressure chemical vapor deposition (LPCVD) or the other CVD methods to a thickness in the range between 500 to 3000 Angstroms. The purpose of forming the nitride layer is to act as a hard mask of active regions 50 during the dry etching process for opening the shallow trenches 40. The nitride layer 30 can be also replaced by an oxynitride layer. The drying etching step is operated to etch the nitride layer 30, the first oxide layer 20, and the silicon substrate 10 in sequence, in order to open the shallow trenches 40. The purpose of the thermal oxidation process is to anneal the sidewall of the shallow trenches 40, so that the damages induced by ion bombardment could be fixed.

Referring now to FIG. 3, a wet etching process to the nitride layer and the first ion implantation for threshold voltage adjustment according to the key feature of the present invention is shown. At first a wet etching step is performed to the nitride layer 30 to remove the nitride layer in the range between 30 to 300 Angstroms laterally and vertically, so that the part of the nitride layer at the edge of the active regions 50A (hereinafter edging regions 50A) is removed. Because the thickness of the nitride layer is much larger than that of the removed layer, almost of the nitride layer 30 is left. Next, the first ion implantation process 70 for threshold voltage adjustment is performed.

The wet etching process of the nitride layer 30 is performed by heated phosphoric acid. The first ion implantation process 70 for threshold voltage adjustment makes use of $PH_3$ or $AsH_3$ as the dopant source in the 2- to 200-KeV range to penetrate through the first oxide layer 20 into the silicon substrate 10. The doping concentration must have the same numerical order with that of the subsequent second ion implantation for threshold voltage adjustment in the range between 1E12 to 1E14 $cm^{-2}$. About this step, the first ion implantation process 70 for threshold voltage adjustment is accepted only by the shallow trenches 40 and the edging regions 50A. Except the edging regions 50A, the silicon substrate 10 at the active regions are not ion-implanted because the nitride layer 30 serves as an implantation mask.

Referring now to FIG. 4, shallow trench isolations 80 are form. In order to form the shallow trench isolations 80, a second oxide layer is deposited at first to fill the shallow trenches 40. Next, a process of chemical mechanical polishing (CMP) is performed to remove the second oxide layer on the nitride layer 30, so that it remains only in the recesses, with its top surface at the same level as the nitride layer. The top surface of the nitride layer 30 is thus exposed. Thereafter, the nitride layer 30, the partial second oxide layer 30 on the silicon substrate 10, and the first oxide layer 10 are continuously removed to accomplish the process of shallow trench isolations 80.

The second oxide layer is formed by using high density plasma chemical vapor deposition (HDPCVD) or the other CVD technologies. The removal of the nitride layer 30 is performed by heated phosphoric acid. Both of the oxide layer are removed by means of wet etching process using HF.

Referring now to FIG. 5, the second ion implantation 90 for threshold voltage adjustment is performed, and the whole threshold voltage adjustment is accomplished. The second ion implantation process 90 for threshold voltage adjustment makes use of boron or $BF_3$ as the dopant source in the 2- to 200-KeV range to penetrate through the first oxide layer 20. The choice of doping concentration depends on the real application in the range between 1E12 to 1E14 $cm^{-2}$.

As shown in FIG. 5, active regions 50 are ion-implanted by the second ion implantation process 90 for threshold voltage adjustment. However, according to both FIG. 3 and FIG. 5, the edging regions 50A are not only ion-implanted by the second ion implantation process 90, but also by the first ion implantation process 70 for threshold voltage adjustment. As mentioned above, the dopant concentration of the first ion implantation is at the same numerical order with that of the second ion implantation. As a results, the dopant concentration at the edging regions 50A is much heavier than that at the active regions 50. Because the edging regions 50A has much higher dopant concentration, the dopant at the active regions 50 won't diffuse toward the edging regions 50A during the subsequent thermal processes. As a result, the drawback of losing dopant concentration in the convention art is overcome. Therefore, the MOS transistors by means of this present invention have very precise and stable threshold voltage.

It is to be understood that although the present invention has been described with reference to particular preferred embodiments, it should be appreciated that numerous modifications, variations and adaptations may be made without departing from the scope of the invention as defined in the claims.

What is claimed is:

1. A method of performing threshold voltage adjustment for MOS transistors, wherein said threshold voltage adjustment is performed by means of P-type ion implantation, comprising the steps of:
   a. forming a first oxide layer and a layer of hard mask on a silicon substrate wherein the layer of hard mask comprises a nitride or oxynitride layer;
   b. forming shallow trenches and active regions by using photolithography and anisotropic etching steps;
   c. removing part of said layer of hard mask laterally and vertically so that part of the nitride oxynitride layer at an edge of the active region is removed wherein a part of the silicon substrate is exposed;
   d. performing a first ion implantation including the edge of the active region for threshold voltage adjustment by using P-type ion implantation;
   e. completing shallow trench isolations; and
   f. performing a second ion implantation, which includes said edge of the active region previously exposed to ion implantation so that said edge of the active region has a much higher dopant concentration than other portions of said active regions, for threshold voltage adjustment by using P-type ion implantation.

2. The method of claim 1, wherein said first oxide layer has a thickness in the range between 50 to 500 Angstroms.

3. The method of claim 1, wherein said hard mask is a nitride layer.

4. The method of claim 1, wherein said hard mask is an oxynitride layer.

5. The method of claim 1, wherein said hard mask has a thickness in the range between 500 to 3000 Angstroms.

6. The method of claim 1, further including a thermal oxidation process after the step of forming shallow trenches.

7. The method of claim 1, wherein said removing part of said layer of hard mask step is to remove said layer of hard mask in the range between 30 to 300 Angstroms.

8. The method of claim 1, wherein said first ion implantation for threshold voltage adjustment is performed at an energy between 10 to 80 KeV and at a dose between 1E12 to 1E14 $cm^{-2}$.

9. The method of claim 1, wherein said step of completing shallow trench isolations comprising the steps of:
   a. depositing a second oxide layer to fill said shallow trenches;

b. performing a chemical mechanical polishing step to remove a part of said second oxide layer on said layer of hard mask;

c. removing said layer of hard mask, a part of said second oxide layer on said silicon substrate, and said first oxide layer continuously.

10. The method of claim 1, wherein said second ion implantation for threshold voltage adjustment is performed at an energy between 10 to 80 KeV and at a dose between 1E12 to 1E14 $cm^{-2}$.

11. A method of performing threshold voltage adjustment for MOS transistors, wherein said threshold voltage adjustment is performed by means of N-type ion implantation, comprising the steps of:

a. forming a first oxide layer and a layer of hard mask on a silicon substrate wherein the layer of hard mask comprises a nitride or oxynitride layer;

b. forming shallow trenches and active regions by using photolithography and anisotropic etching steps;

c. removing part of said layer of hard mask laterally and vertically so that part of the nitride oxynitride layer at an edge of the active region is removed wherein a part of the silicon substrate is exposed;

d. performing a first ion implantation including the edge of the active region for threshold voltage adjustment by using N-type ion implantation;

e. completing shallow trench isolations; and f. performing a second ion implantation, which includes said edge of the active previously exposed to ion implantation so that said edge of the active region has a much higher dopant concentration than other portions of said active regions, for threshold voltage adjustment by using N-type ion implantation.

12. The method of claim 11, wherein said first oxide layer has a thickness in the range between 50 to 500 Angstroms.

13. The method of claim 11, wherein said hard mask is a nitride layer.

14. The method of claim 11, wherein said hard mask is an oxynitride layer.

15. The method of claim 11, wherein said hard mask has a thickness in the range between 500 to 3000 Angstroms.

16. The method of claim 11, further including a thermal oxidation process after the step of forming shallow trenches.

17. The method of claim 11, wherein said removing part of said layer of hard mask step is to remove said layer of hard mask in the range between 30 to 300 Angstroms.

18. The method of claim 11, wherein said first ion implantation for threshold voltage adjustment is performed at an energy between 10 to 80 KeV and at a dose between 1E12 to 1E14 $cm^{-2}$.

19. The method of claim 11, wherein said step of completing shallow trench isolations comprising the steps of:

a. depositing a second oxide layer to fill said shallow trenches;

b. performing a chemical mechanical polishing step to remove a part of said second oxide layer on said layer of hard mask;

c. removing said layer of hard mask, a part of said second oxide layer on said silicon substrate, and said first oxide layer continuously.

20. The method of claim 11, wherein said second ion implantation for threshold voltage adjustment is performed at an energy between 10 to 80 KeV and at a dose between 1E12 to 1E14 $cm^{-2}$.

* * * * *